US006809915B2

United States Patent
Lai et al.

(10) Patent No.: US 6,809,915 B2
(45) Date of Patent: Oct. 26, 2004

(54) GATE-EQUIVALENT-POTENTIAL CIRCUIT AND METHOD FOR I/O ESD PROTECTION

(75) Inventors: Chun-Hsiang Lai, Taichung (TW); Meng-Huang Liu, Hsinchu (TW); Shin Su, Banchiau (TW); Tao-Cheng Lu, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 233 days.

(21) Appl. No.: 10/266,572

(22) Filed: Oct. 9, 2002

(65) Prior Publication Data

US 2003/0235022 A1 Dec. 25, 2003

(30) Foreign Application Priority Data

Jun. 19, 2002 (TW) ........................................ 91113434 A

(51) Int. Cl.[7] .............................. H02H 3/20; H02H 3/22
(52) U.S. Cl. ......................................... 361/111; 361/91.1
(58) Field of Search ......................... 361/111, 56, 91.1, 361/91.5; 257/241, 35

(56) References Cited

U.S. PATENT DOCUMENTS

| 6,583,972 B2 | * | 6/2003 | Verhaege et al. ............. 361/56 |
| 6,639,283 B1 | * | 10/2003 | Hung et al. ................. 257/355 |
| 6,661,273 B1 | * | 12/2003 | Lai et al. .................... 327/310 |
| 6,750,517 B1 | * | 6/2004 | Ker et al. .................... 357/401 |

* cited by examiner

Primary Examiner—Brian Sircus
Assistant Examiner—Z Kitov
(74) Attorney, Agent, or Firm—Rabin & Berdo, P.C.

(57) ABSTRACT

A gate-equivalent-potential circuit and method for an I/O pad ESD protection arrangement including used and unused MOS fingers connected to the I/O pad comprises a switch connected between the gates of the MOS fingers, an ESD detector connected to the switch to turn on the switch upon an ESD event and a gate-modulated circuit connected to the gate of the unused finger to couple a voltage thereto to reduce the triggering voltage of the transistors within the fingers.

15 Claims, 9 Drawing Sheets

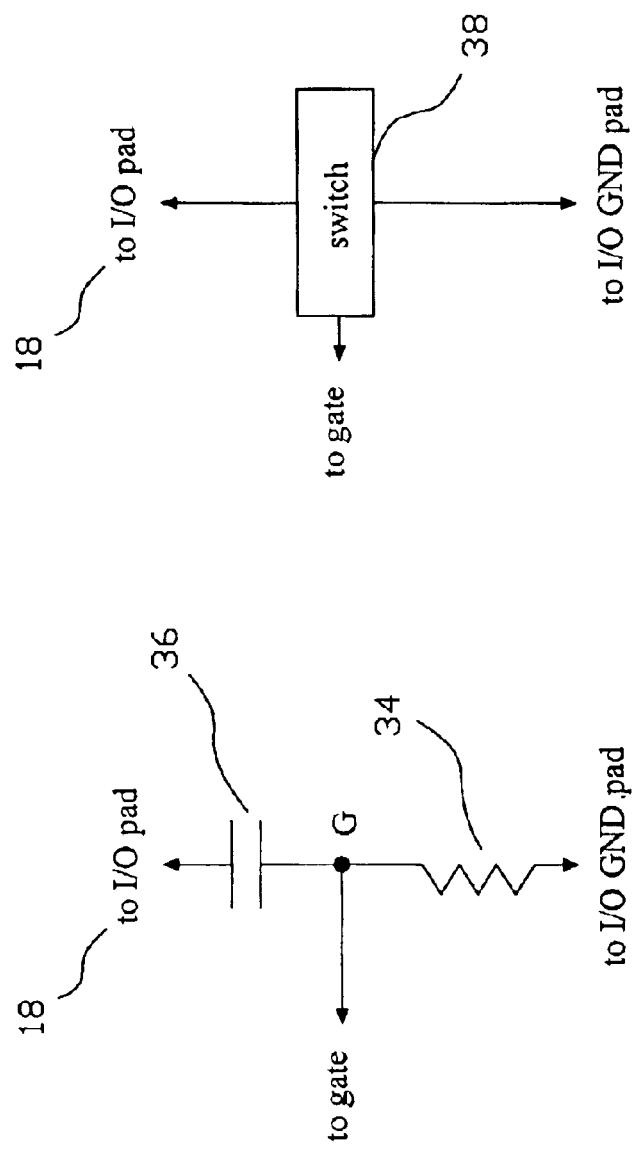

GATE-EQUIVALENT-POTENTIAL CIRCUIT AND METHOD FOR I/O ESD PROTECTION

FIELD OF THE INVENTION

The present invention relates generally to the electrostatic discharge (ESD) protection for integrated circuit (IC), and more particularly to a gate-equivalent-potential circuit and method for input/output (I/O) ESD protection.

BACKGROUND OF THE INVENTION

Complementary metal-oxide-semiconductor (CMOS) integrated circuit devices are vulnerable to ESD induced failure. Especially, the applications of thin gate oxide, short channel and shallow junction for high integration density as well as the lightly doped drain (LDD) and self-aligned silicide (salicide) further degrade the performance of MOS devices against ESD. Various techniques have been disclosed to self-protect output buffers or other I/O pads against ESD failures. Some of these measures include diode clamps, lateral punch-through devices and guard ring collectors around an I/O pad, and these circuits are reasonably effective to protect the integrated circuit devices.

ESD protection structures are classified into two categories including structures to protect input buffers and structures to protect output buffers and I/O pads. Protection of input buffers is relatively simple because a CMOS gate does not conduct current. Accordingly, a special protection structure is implemented on the input buffer that restricts the gate voltage of a transistor to a maximum breakdown voltage. To the contrary, the other category of output buffers and I/O pads includes structures that are more difficult to protect. This difficultly results from that the output buffer may conduct current by ESD stress and thus may be damaged. The protection structure must be designed and layout constructed so that the protection structure discharges the ESD stress without self-damage while the output buffer conducts only a minimum current under ESD stress conditions. Two well-known ESD protection structures substantially utilize the transistor turn-on mechanism and the transistor snapback mechanism in the protection circuit, where the former is characteristic of the threshold voltage for channel conduction, and the latter is characteristic of the transistor breakdown voltage. The more popular snapback mechanism is the introduction of an ESD protection structure such as NMOS transistors onto the interconnection between the I/O pad and the internal or core circuit. Upon ESD event, the internal circuit is protected by bypassing of the built-in parasitic bipolar transistors. To release large amount of ESD current by the NMOS transistors without excessive gate width structure, fingers layout is employed for the ESD protection circuit. Unfortunately, the fingers of NMOS transistors are hardly to turn on uniformly due to the inherent structure difference resulted from the fingers arrangement, resulting in that the ESD current will concentrate in a small region and thus burn out the device. As such, even a large ESD protection device will not have acceptable performance.

In proposed solutions, with the gate of an NMOS transistor coupled to a positive voltage, the triggering voltage of the NMOS transistor is then reduced. However, in a multiple fingers NMOS transistor including used and unused MOS fingers, of which the used MOS finger is referred to one with its gate connected to a pre-driver and the unused MOS finger is referred to one with its gate grounded, due to the parasitic capacitance between the drain and the gate of the MOS transistor, the gate of the used finger will be coupled with a positive voltage that makes the triggering voltage of the used finger much lower than that of the unused one, and thus the used finger will be triggered first and destroyed and the unused one will not be triggered. In other words, the ESD endurance of the NMOS transistor depends on the width of the used fingers instead of the total width of the NMOS transistor. To prevent from unbalance triggering between the used and unused fingers, the gate of the unused finger is not supposed to be grounded directly, but coupled with a positive voltage during an ESD event. Some of prior arts insert a resistor between the gate of the unused finger and ground, some introduce a pass gate with its gate connected to a supply voltage, and the others employ more complicated circuit. The purpose of these prior arts is to have the gates of the used and unused fingers at an equal potential during an ESD event for them to be triggered simultaneously. However, a resister consumes a large chip area and can not ensure the gates at equal potential for the used and unused fingers, a pass gate also can not promise equivalent-gate-potential for the used and unused fingers even it occupies a smaller chip area, and a complicated circuit will complicate the design of the chip circuit.

Therefore, it is desired a circuit and method to have the gates of the used and unused fingers equivalent potential during an ESD event.

SUMMARY OF THE INVENTION

One object of the present invention is to provide a gate-equivalent-potential circuit and method for I/O ESD protection, by which the gate of used MOS finger is coupled to the gate of unused MOS finger by a switch that is turned on by an ESD detector upon an ESD event.

In a gate-equivalent-potential circuit for I/O ESD protection, according to the present invention, a switch is inserted between the gates of used and unused MOS fingers that is connected to an I/O pad, an ESD detector is connected to the switch to turn it on upon an ESD event, and a gate-modulated circuit is connected to the gate of the unused MOS finger to couple a voltage thereto. During normal operation, the switch is kept off. Once an ESD event occurred, the voltage on the I/O pad increases rapidly, the ESD detector sends a signal to turn on the switch for the gate of the unused MOS finger to be coupled to the gate of the used MOS finger such that the gates of the used and unused MOS fingers approach to a same potential, thereby the ESD fingers are triggered more uniformly.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which:

FIGS. 2A to 2C show three embodiments for the gate-modulated circuit of FIG. 1, among which FIG. 2A includes an RC circuit, FIG. 2B includes a switch, and FIG. 2C includes a direct ground connection for the gate;

FIGS. 3A to 3B show two embodiments for the ESD detector of FIG. 1, among which FIG. 3A is for PMOS pump, and FIG. 3B is for NMOS pump;

FIGS. 4A to 4C show three embodiments for the regulator of FIG. 3A to 3B, among which FIGS. 4A and 4B are for PMOS pump, and FIG. 4C is for NMOS pump;

FIGS. 8A to 8C show three devices connected to an I/O pad, among which FIG. 8A is an NMOS transistor with its gate grounded, FIG. 8B is an on-state NMOS, and FIG. 8C is a gate-modulated NMOS transistor.

DETAILED DESCRIPTION OF THE INVENTION

Figure 1:
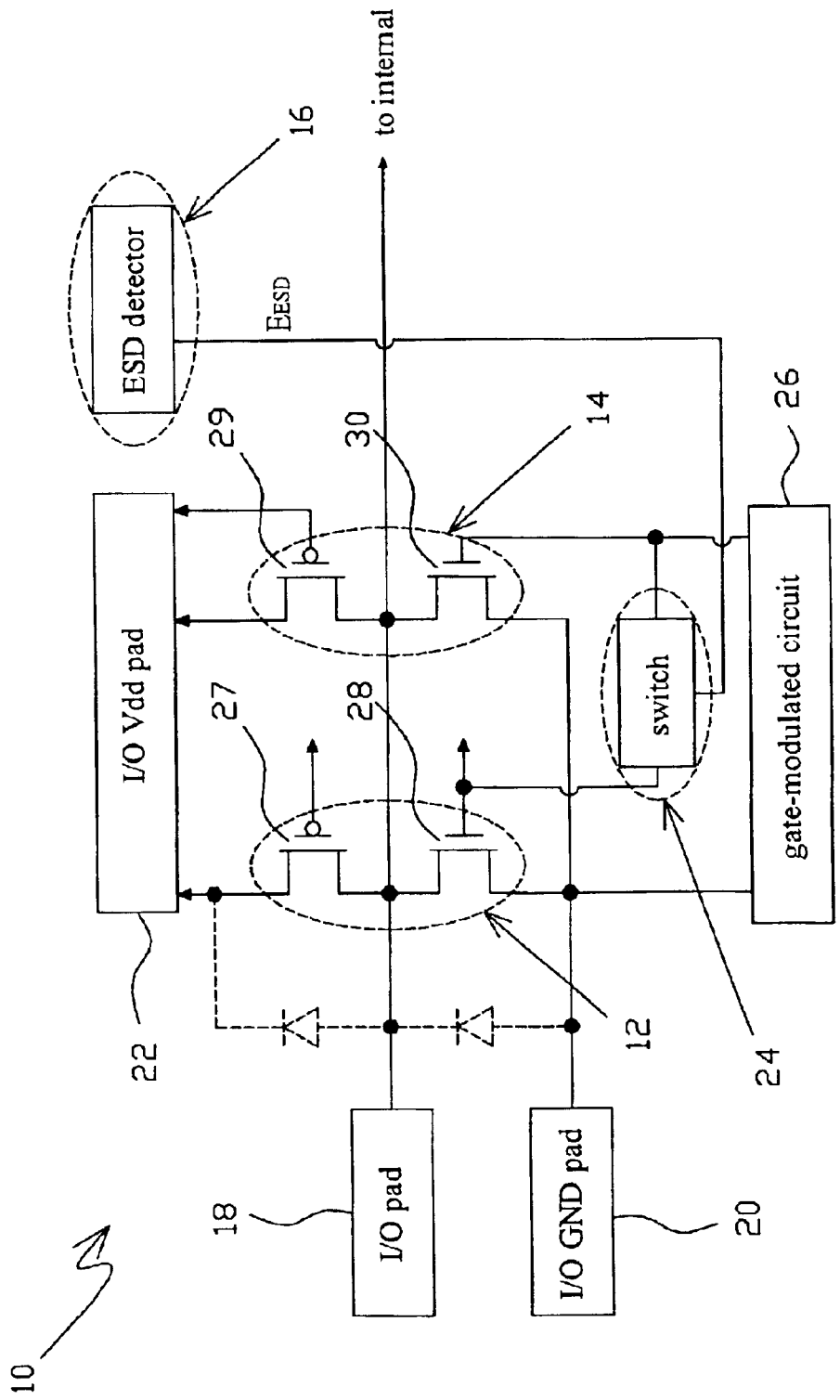
FIG. 1 is a preferred embodiment according to the present invention.

FIG. 1 is a preferred embodiment according to the present invention, in which an ESD protection arrangement 10 comprises an used MOS finger 12 and an unused MOS finger 14 connected to an I/O pad 18, an I/O power supply pad 22 and an I/O ground pad 20 to release the ESD current from the I/O pad 18 during an ESD event. The NMOS transistors 28 and 30 of the MOS fingers 12 and 14 are connected between the I/O pad 18 and the I/O ground pad 20, and the PMOS transistors 27 and 29 are connected between the I/O pad 18 and the I/O power supply pad 22. A switch 24 is connected between the gates of the NMOS transistors 28 and 30, an ESD detector 16 is connected to the switch 24, and a gate-modulated circuit 26 is connected to the gate of the NMOS transistor 30 and the I/O ground pad 20, respectively. During normal operation, the switch 24 is turned off. When the I/O pad 18 is stressed by a positive ESD current, the voltage on the I/O pad 18 increases rapidly and in turn turns on the ESD detector 16 to send out an ESD signal $E_{ESD}$ to turn on the switch 24. As a result, the gates of the NMOS transistors 28 and 30 are coupled together to make them approach to a same potential for being uniformly triggered.

The gate-modulated circuit 26 in FIG. 1 serves as a soft-pull-down circuit to couple a voltage to the gates of the NMOS transistors 28 and 30 of the MOS fingers 12 and 14 during an ESD event for reducing the triggering voltage of the NMOS transistors, which can be a resistor, a pass gate, a switch or nothing. FIGS. 2A to 2C show three embodiments for the gate-modulated circuit 26. In FIG. 2A a resistor 34 and a capacitor 36 connected in series are connected between the I/O ground pad 20 and the I/O pad 18, and the node G between the resistor 34 and the capacitor 36 is connected to the gate of the MOS finger. When an ESD event is occurred, the capacitor 36 is charged to produce a voltage to couple to the gate of the MOS finger. In FIG. 2B a switch 38 is connected to the I/O pad 18, the I/O ground pad 20, and the gates of the MOS fingers. During normal operation, the switch 38 is of low impedance with respect to the I/O ground pad 20. When an ESD event is occurred, the switch 38 becomes of high impedance to thereby couple a voltage to the gate of the MOS finger. In FIG. 2C the gate of the MOS finger is connected to the I/O ground pad 20 directly.

Figure 3B:
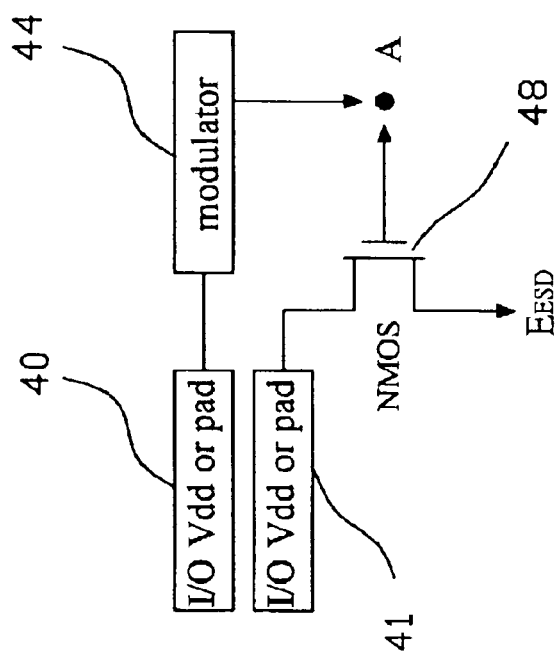
Figure 3A:
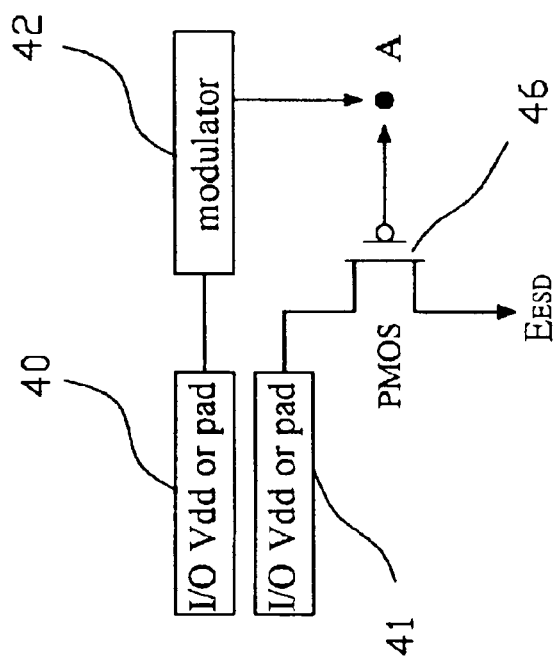

FIGS. 3A to 3B show two embodiments for the ESD detector 16 in FIG. 1, which includes a modulator connected to a pump. In FIG. 3A a PMOS transistor 46 is served as a pump, a modulator 42 is connected to the gate of the PMOS transistor 46 with a node A, and the modulator 42 and the PMOS transistor 46 are connected to I/O power supply or I/O pad 40 and 41, respectively. During normal operation, the modulator 42 sends a high level signal to the node A, and the PMOS transistor 46 is thus turned off. While an ESD event is occurred, the modulator 42 sends out a low level signal to the node A to turn on the PMOS transistor 46, and thereby sending out an ESD signal $E_{ESD}$. In FIG. 3B an NMOS transistor 48 is served as a pump, a modulator 44 is connected to the gate of the NMOS transistor 48 with a node A, and the modulator 44 and NMOS transistor 48 are connected to I/O power supply or I/O pad 40 and 41, respectively. During normal operation, the modulator 44 sends a low level signal to the node A, and thus the NMOS transistor 48 is turned off. While an ESD event is occurred, the modulator 44 sends out a high level signal to the node A to turn on the NMOS transistor 48, and thereby sending out an ESD signal $E_{ESD}$.

Figure 4A:
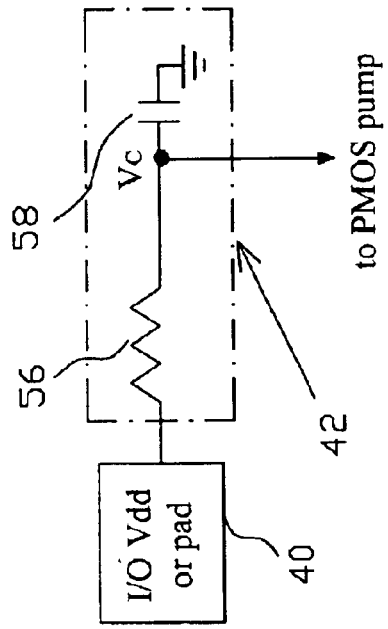
Figure 4B:
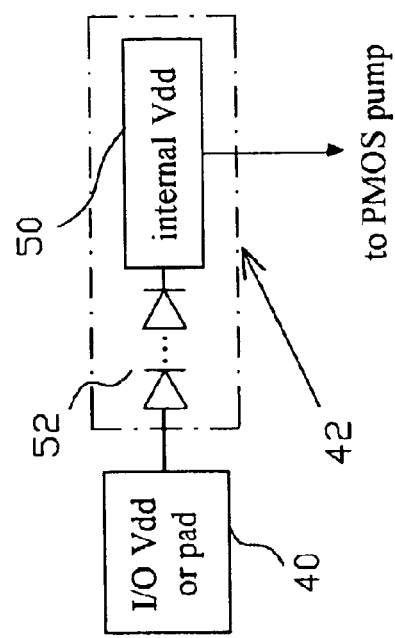
Figure 4C:
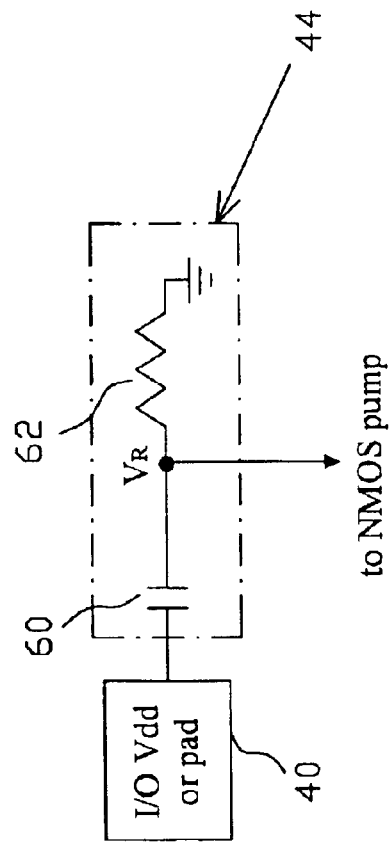

FIGS. 4A to 4C show various embodiments for the modulator 42 and 44. The embodiment of FIG. 4A is for PMOS pump, in which the modulator 42 comprises a diode string 52 connected to an internal supply voltage 50. During normal operation, the high level signal of the internal power supply 50 keeps the PMOS pump turned off. During an ESD event, the I/O power supply or I/O pad 40 is charged to a higher voltage due to the stress of the positive ESD current, while the diode string 52 keeps the internal supply voltage 50 lower than that of the I/O power supply or I/O pad 40, thereby turning on the PMOS pump. The embodiment of FIG. 4B is also for PMOS pump, which includes an RC delay circuit as the modulator 42 with a resistor 56 connected between a capacitor 58 and the I/O power supply or I/O pad 40, the capacitor 58 grounded at one end, and the node $V_C$ between the resistor 56 and the capacitor 58 connected to the PMOS pump. During normal operation, the high level signal $V_C$ from the RC delay circuit keeps the PMOS pump turned off. While an ESD event is occurred, the phase of the I/O power supply or I/O pad 40 is delayed by the RC circuit so as to produce a low level signal to turn on the PMOS pump. The embodiment of FIG. 4C is for NMOS pump, which also includes an RC delay circuit as the modulator 44 with a capacitor 60 connected between the I/O power supply or I/O pad 40 and a resistor 62, the resistor 62 grounded at one end, and the node $V_R$ between the capacitor 60 and the resistor 62 connected to the NMOS pump. During normal operation, the low level signal $V_R$ from the RC delay circuit keeps the NMOS pump turned off. While an ESD event is occurred, the phase of the I/O power supply or I/O pad 40 is lead by the RC circuit to produce a high level signal to turn on the NMOS pump.

There are various apparatus for the switch 24 of FIG. 1, such as a pass gate or the like that is normal turned off and is turned on upon an ESD event.

Figure 5:
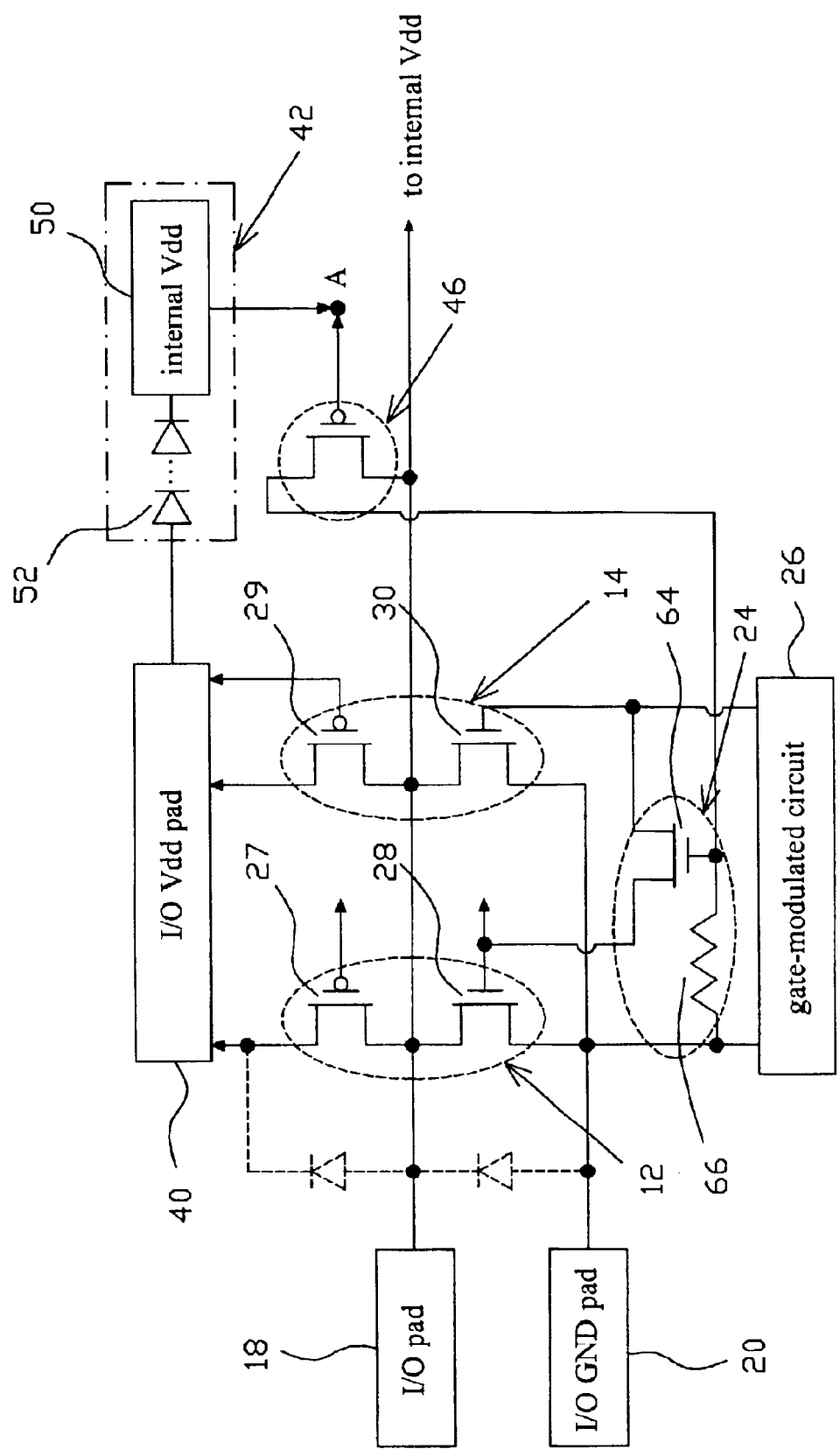
FIG. 5 shows an embodiment for integrated circuit with separated power supplies.

FIG. 5 shows an embodiment for the integrated circuit with separated power supplies. The integrated circuit comprises at least two power supplies, for example, an I/O power supply 40 and an internal power supply 50. The switch 24 comprises an NMOS transistor 64 with its drain and source connected to the gates of NMOS transistor 30 and 28, respectively, and a resistor 66 connected between the gate of the NMOS transistor 64 and the I/O ground pad 20. The modulator 42 comprises a diode string 52 connected to the internal supply voltage 50 and its output connected to the gate of the PMOS pump 46 with the node A. The output from the drain of the PMOS pump 46 is connected to the gate of the NMOS transistor 64 of the switch 24. During normal operation, the high level signal $E_{ESD}$ from the modulator 42 keeps the PMOS pump 46 turned off. When the I/O pad 18 is stressed by a positive ESD current, the I/O power supply pad 40 is charged to a higher voltage and the diode string 52 still keeps the voltage on the internal power supply 50 lower than that of the I/O power supply pad 40, the PMOS pump 46 is therefore triggered to be turned on. An unused finger or additional transistor can be used as the PMOS pump 46, which occupies only a small chip area. When the I/O pad 18 is stressed by a positive ESD current, the voltage thereon increases rapidly, such that the voltage on node A will be lower than that on the I/O pad 18, and the PMOS pump 46 is eventually turned on due to the diode string 52. Once the PMOS pump 46 is turned on, it will drain some of the ESD current from the I/O pad 18 to the I/O ground pad 20 through the resistor 66 of the switch 24, then the voltage on the gate of the NMOS transistor 64 is pulled up to turn on the NMOS transistor 64. An unused finger or additional transistor can be used as the NMOS transistor 64, which occupies only a small chip area. After the NMOS transistor 64 is turned on, it couples the gates of the NMOS transistor 28 and 30 together to make them approach to a same potential, and thus all the fingers of the NMOS ESD arrangement are turned on uniformly.

Figure 6:
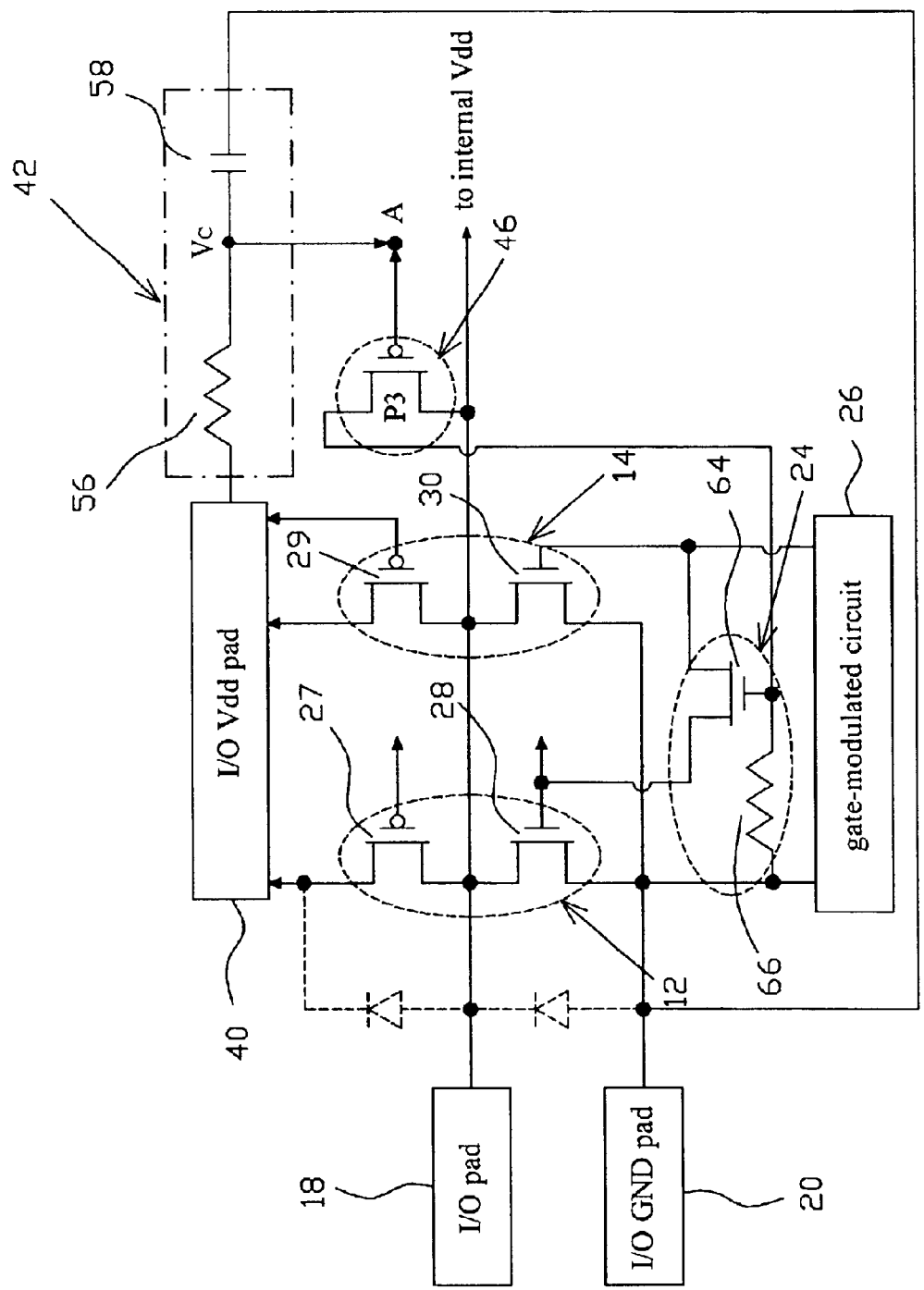
FIG. 6 shows an embodiment for integrated circuit with single power supply.

FIG. 6 shows an embodiment for the integrated circuit with signal power supply, in which the pump 46 and the switch 24 are same as those in FIG. 5, but the modulator 42 includes a resistor 56 connected between the I/O supply voltage pad 40 and a capacitor 58 with the other end of the capacitor 58 connected to the I/O ground pad 20 and the voltage on the node $V_C$ between the resistor 56 and the capacitor 58 to control the PMOS pump 46. The modulator 42 includes an RC delay circuit, by which the RC delaying time is used to identify the normal operation and the ESD event. For example, an ESD event is occurred typically within the range of several nanoseconds and the time duration for the voltage on the I/O power supply pad 40 increases normally in centisecond grade, thus the RC time constant of the modulator 42 can be selected in microsecond grade for an effective operation. During normal operation, the voltage on the I/O power supply pad 40 increases slowly enough for the voltage on the node A to follow the voltage on the I/O power supply pad 40 and thus to turn off the pump 46 eventually. During an ESD event, the voltage on the I/O supply voltage pad 40 is pushed up so rapidly that the voltage on the node A fails to follow and thus turns on the pump 46. During normal operation, the output signal $E_{ESD}$ of the modulator 42 controls the PMOS pump 46 turned off. When the I/O pad 18 is stressed by a positive ESD current, the voltage thereon increases rapidly so as for the voltage on the node A lower than that on the I/O pad 18 and thereby turns on the PMOS pump 46 since the RC time constant of the modulator 42 is selected much larger than the period of an ESD event. When the PMOS pump 46 is turned on, it drains some of the ESD current from the I/O pad 18 to the I/O ground pad 20 through the resistor 66 of the switch 24, which in turn pushes up the voltage on the gate of the NMOS transistor 64 and turns on the NMOS transistor 64 eventually. The conduction of the NMOS transistor 64 couples the gates of the NMOS transistor 28 and 30 together such that the voltages thereon are approaching to equivalent, and thus all the fingers of NMOS ESD arrangement are turned on uniformly.

Figure 7:
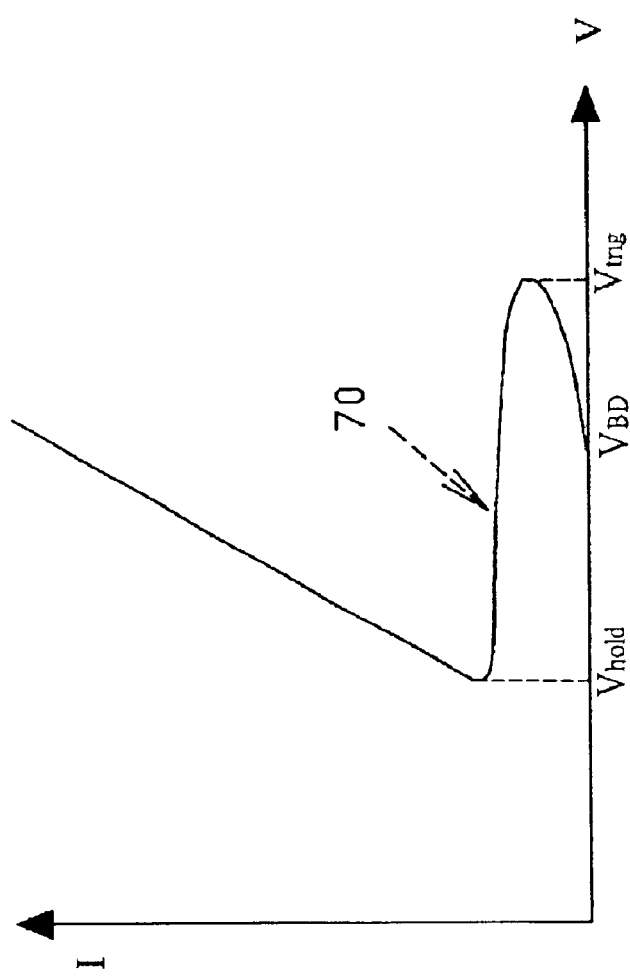
FIG. 7 shows the current-voltage (I–V) curve of an ESD device.

FIG. 7 shows the snapback I-V curve for an ESD apparatus. When stressing an ESD apparatus, its voltage rises up rapidly, and almost no current flows therethrough until it breaks down. Therefore, the breakdown voltage $V_{BD}$ must be much higher than the normal operation voltage of the integrated circuit in order for the ESD apparatus not to influence the normal operation of the integrated circuit. After the breakdown point $V_{BD}$, the current starts to increase until the triggering point $V_{trig}$ is reached, then it goes into the negative resistive region where the voltage drops down rapidly and the current does not change much. The negative resistive region is very short, and thereafter the holding point $V_{hold}$ is reached soon, after that the current increases quickly with the voltage rising up. The region after the holding point $V_{hold}$ is used to by pass most of ESD current.

Figure 8:
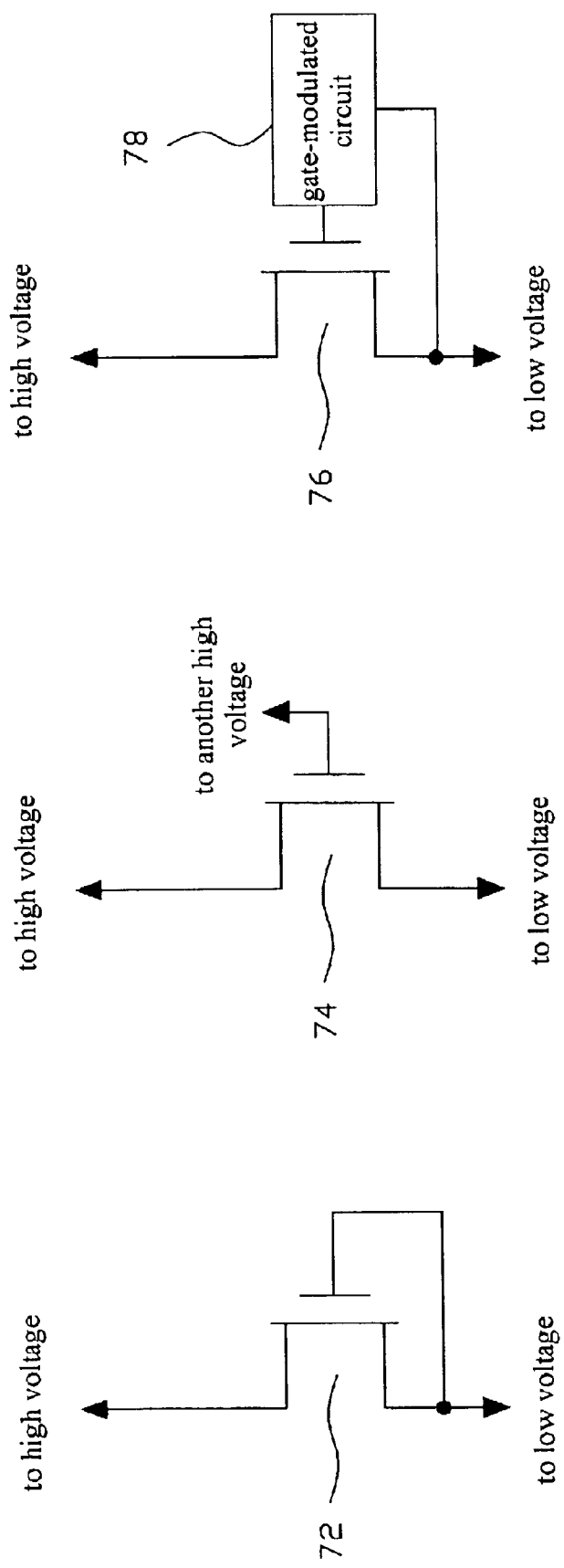
Figure 9:
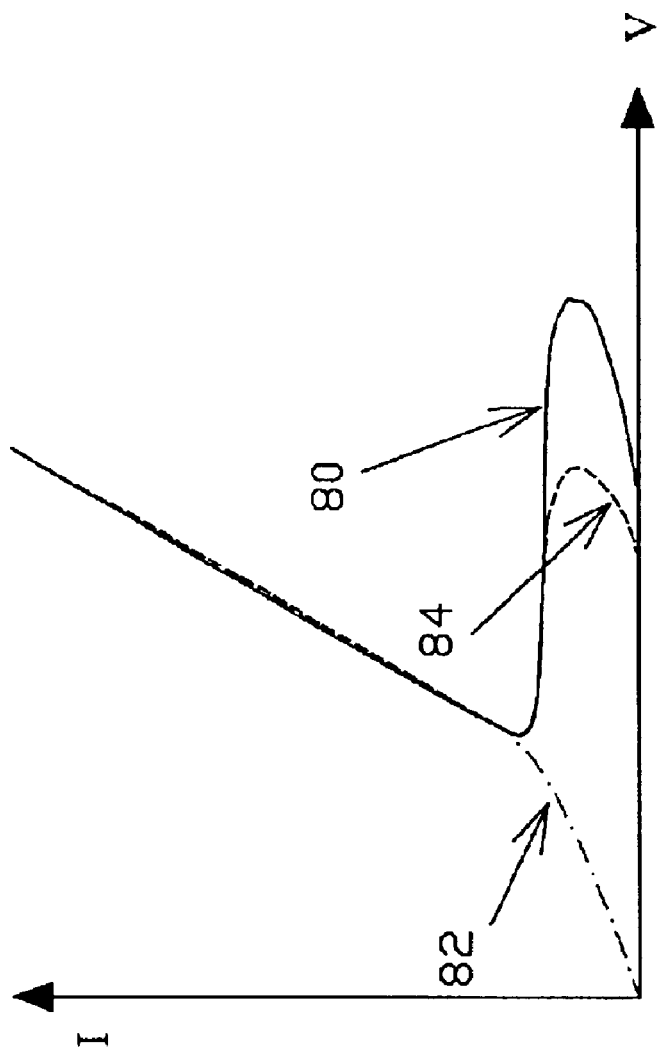
FIG. 9 shows the I-V curves for the devices of FIGS. 8A to 8C.

FIGS. 8A to 8C show three devices on the I/O pad 18. FIG. 8A shows a grounded-gate NMOS transistor 72, which has its source and gate connected together to a low voltage and its drain connected to a high voltage. FIG. 8B shows an on-state NMOS transistor 74 which is connected between a high voltage and a low voltage and whose gate is connected with another high voltage. FIG. 8C shows a gate-modulated NMOS transistor 76, which has its gate and source connected with a gate-modulated circuit 78 therebetween and its drain connected to a high voltage. The gate of a used finger is floating during an ESD event, and the floating gate NMOS transistor is one of the gate-modulated NMOS transistors. FIG. 9 shows the I–V curves for the three devices shown in FIGS. 8A to 8C, among which the curve 80 is for the gate-grounded NMOS transistor 72 shown in FIG. 8A, the curve 82 is for the on-state NMOS transistor 74 shown in FIG. 8B, and the curve 84 is for the gate-modulated NMOS transistor shown in FIG. 8C. During an ESD event, as shown in FIG. 9, the triggering voltage of the gate-modulated NMOS transistor 76 (curve 84) is lower than that of the gate-grounded NMOS transistor 72 (curve 80), thereby the used NMOS finger will be turned on first and drains most of the ESD current, and it will be destroyed at a lower level due to the difficulty of turning on the unused NMOS finger whose gate is grounded directly). Although prior art schemes couple the gate of the NMOS finger with a voltage to reduce the triggering voltage thereof in order to improve the ESD endurance, it is not possible to have the used and unused fingers to be turned on simultaneously due to the different gate-modulated circuits for the used and unused fingers. Contrarily, in the invented arrangement, the gate-modulated-potential circuit and the gate-equivalent circuit are both used to make the voltages on the gates of the used and unused MOS fingers approaching equal, it thus ensures that the used and unused MOS fingers will be triggered in the same time. Moreover, such scheme uses merely an unused finger of PMOS transistor for pump and a pass gate and a resistor for switch, so that only a small chip area is consumed for the voltages on the gates of the used and unused fingers to be effectively equal.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A gate-equivalent-potential circuit for I/O ESD protection arrangement including a used and an unused MOS fingers connected to an I/O pad on a substrate, said gate-equivalent-potential circuit comprising:

a switch connected between a gate of said used MOS finger and a gate of said unused MOS finger;

an ESD detector connected to said switch; and a gate-modulated circuit connected to said gate of said unused MOS finger.

2. A gate-equivalent-potential circuit of claim 1, wherein said ESD detector comprises a modulator connected to a pump.

3. A gate-equivalent-potential circuit of claim 2, wherein said pump comprises a PMOS transistor.

4. A gate-equivalent-potential circuit of claim 3, wherein said modulator comprises a diode string connected with an internal supply voltage.

5. A gate-equivalent-potential circuit of claim 3, wherein said modulator comprises an RC delay circuit.

6. A gate-equivalent-potential circuit of claim 2, wherein said pump comprises an NMOS transistor.

7. A gate-equivalent-potential circuit of claim 6, wherein said modulator comprises an RC delay circuit.

8. A gate-equivalent-potential circuit of claim 1, wherein said gate-modulated circuit comprises a resistor.

9. A gate-equivalent-potential circuit of claim 1, wherein said gate-modulated circuit comprises a pass gate.

10. A gate-equivalent-potential circuit of claim 1, wherein said gate-modulated circuit comprises a second switch.

11. A gate-equivalent-potential circuit of claim 1, wherein said gate-modulated circuit comprises a wire.

12. A gate-equivalent-potential circuit of claim 1, wherein said switch comprises a gate-biased MOS transistor.

13. In an I/O ESD protection arrangement including a used and an unused MOS fingers connected to an I/O pad on a substrate, a gate-equivalent-potential method for a gate of said used MOS finger and a gate of said unused MOS finger upon an ESD event comprising the steps of:
  producing an ESD signal; and
  coupling said gates of said used and unused MOS fingers together in responsive to said ESD signal.

14. A method of claim 13, further comprising coupling said gate of said unused MOS fingers to a voltage.

15. A method of claim 13, wherein the step of producing said ESD signal comprises the steps of:
  producing a turn-on signal;
  turning on a pump by said turn-on signal; and
  sending out said ESD signal from said pump.

* * * * *